United States Patent
Cao et al.

(10) Patent No.: US 9,515,216 B2
(45) Date of Patent: Dec. 6, 2016

(54) LIGHT SENSITIVE SWITCH FOR SEMICONDUCTOR PACKAGE TAMPER DETECTION

(71) Applicant: International Business Machines Corporation, Armonk, NY (US)

(72) Inventors: Qing Cao, Yorktown Heights, NY (US); Shu-Jen Han, Cortlandt Manor, NY (US); Li-Wen Hung, Mahopac, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/744,171

(22) Filed: Jun. 19, 2015

(65) Prior Publication Data

US 2016/0322529 A1    Nov. 3, 2016

Related U.S. Application Data

(63) Continuation of application No. 14/700,376, filed on Apr. 30, 2015.

(51) Int. Cl.
| | |
|---|---|
| *H01L 31/075* | (2012.01) |
| *H01L 31/18* | (2006.01) |
| *H01L 31/05* | (2014.01) |
| *B81C 1/00* | (2006.01) |

(52) U.S. Cl.
CPC ........... *H01L 31/075* (2013.01); *B81C 1/0015* (2013.01); *H01L 31/05* (2013.01); *H01L 31/1804* (2013.01)

(58) Field of Classification Search
CPC .............................. H01L 31/075; B81C 1/0015
USPC ............................................................ 438/59
See application file for complete search history.

(56) References Cited

U.S. PATENT DOCUMENTS

| | | | | |
|---|---|---|---|---|
| 5,159,629 | A  * | 10/1992 | Double ................... | G06F 21/87 206/807 |
| 8,829,329 | B2 * | 9/2014  | Deligianni ...... | H01L 31/022458 136/244 |
| 2006/0017108 | A1* | 1/2006 | Raffaelle .................. | G21H 1/04 257/353 |
| 2009/0207473 | A1* | 8/2009 | Bita ...................... | G02B 26/001 359/290 |
| 2009/0251761 | A1* | 10/2009 | Khazeni ............... | G02B 26/001 359/291 |
| 2010/0207764 | A1* | 8/2010 | Muhlberger ....... | G08B 13/1418 340/568.1 |
| 2012/0223403 | A1* | 9/2012 | Keller, III ............. | H01L 23/576 257/428 |

(Continued)

OTHER PUBLICATIONS

List of IBM Patents or Patent Application Treated as Related; YOR920150089US2, Date Filed: Jun. 19, 2015, pp. 1-2.

(Continued)

*Primary Examiner* — Moazzam Hossain
(74) *Attorney, Agent, or Firm* — Cantor Colburn LLP; Vazken Alexanian

(57) ABSTRACT

Embodiments relate to the detection of semiconductor tampering with a light-sensitive circuit. A tamper detection device for an integrated circuit includes a light-sensitive circuit disposed within a package of an integrated circuit. The light-sensitive circuit closes in response to an exposure to a light source, indicating a tamper condition.

5 Claims, 8 Drawing Sheets

(56) References Cited

U.S. PATENT DOCUMENTS

| | | | |
|---|---|---|---|
| 2013/0089943 A1* | 4/2013 | Chen | H01L 31/02167 438/72 |
| 2013/0206206 A1* | 8/2013 | Bjorneklett | F24J 2/4636 136/246 |
| 2013/0250662 A1* | 9/2013 | Katti | G11C 11/16 365/158 |

OTHER PUBLICATIONS

Qing Cao, et al.,"Light Sensitive Switch for Semiconductor Package Tamper Detection," U.S. Appl. No. 14/700,376, filed Apr. 30, 2015.

* cited by examiner

LIGHT SENSITIVE SWITCH FOR SEMICONDUCTOR PACKAGE TAMPER DETECTION

DOMESTIC PRIORITY

This application is a continuation of U.S. patent application Ser. No. 14/700,376, filed Apr. 30, 2015, the disclosure of which is incorporated by reference herein in its entirety.

BACKGROUND

The present invention relates generally to semiconductors, and more specifically, to detectability of semiconductor tampering.

Semiconductor manufacturers may rigorously test a packaged semiconductor component to meet minimal quality standards. During the testing process, the semiconductor component can be marked with its exact part number and quality information on a viewable surface, such as a semiconductor case. Semiconductor manufacturers and end-users may rely on this information to accurately identify the semiconductor component.

However, after the semiconductor component is released into the public domain, tampering may occur. This tampering may include, but is not limited to, an opening of the case of the semiconductor component and/or a modification integrated circuit.

SUMMARY

Embodiments include systems and a method of manufacture for detecting tampering with a semiconductor. According to an embodiment of the present invention, a tamper detection device for an integrated circuit includes a light-sensitive circuit disposed within a package of an integrated circuit, wherein the light-sensitive circuit closes in response to an exposure to a light source, thereby indicating a tamper condition.

According to another embodiment of the present invention, a light-sensitive circuit that includes at least one passive radio-frequency (RF) tag, the light-sensitive circuit closes in response to an exposure to a light source and the RF tag indicates a closure of the light-sensitive circuit.

According to another embodiment of the present invention, a method of forming a tamper detection device for an integrated circuit, comprises depositing a silicon layer on an insulating substrate, forming a patterned hard mask on the silicon layer, etching exposed portions of the silicon layer to form a plurality of silicon planks, removing the hard mask from the plurality of silicon planks, implanting ions defined by photoresist to form at least one PIN junction on the plurality of silicon planks, forming an interconnect layer that electrically connects a plurality of photovoltaic cells, depositing patterned electrodes of a MEMS switch on the interconnect layer, the patterned electrodes include a pull-in electrode and a contact electrode depositing a sacrificial material over the patterned electrodes, forming an arm of the MEMS switch on the sacrificial material, the arm includes a cantilever, etching the sacrificial material from the patterned electrodes, and connecting the MEMS switch with the plurality of photovoltaic cells. The PIN junction has an undoped intrinsic semiconductor region between a p-type semiconductor region and an n-type semiconductor region, and the at least one PIN junction forms a photovoltaic cell.

BRIEF DESCRIPTION OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

FIGS. 6A-6I are a series of cross sectional and top views further illustrating a process for manufacturing the light-sensitive circuit in accordance with an embodiment, in which:

FIG. 6A depicts a thin silicon layer deposited on an insulating substrate;

FIG. 6B depicts a silicon dioxide hard mask deposited on the thin silicon layer;

FIG. 6C depicts a hard mask transferred to the thin silicon layer to form silicon planks;

FIG. 6D depicts silicon planks doped to form p-i-n junctions;

FIG. 6E depicts an interconnect layer to electrically connect photovoltaic cells;

FIG. 6F depicts electrodes deposited with a metal;

FIG. 6G depicts a sacrificial material deposited on the electrodes;

FIG. 6H depicts an arm formed on a mounting surface of the sacrificial material; and FIG. 6I depicts a sacrificial material etch that exposes a space between the arm, the pull-in electrode, and the contact electrode.

DETAILED DESCRIPTION

Counterfeit semiconductor components generally do not meet minimal quality standards and may not work properly if installed in commercial or military systems. As counterfeiters become more sophisticated with the creation of components with accurate dimensions and packaging, it is increasingly difficult to detect a counterfeit component by visual inspection. Accordingly, it is important to have a tampering detection system that goes beyond surface aesthetics. A tampering detection system directly tied to existing component hardware is more difficult to duplicate and avoid triggering by a counterfeiter. Also, by tying the tampering detection system to circuit hardware, the level of technical sophistication required by the counterfeiter to avoid detection increases.

Figure 1:
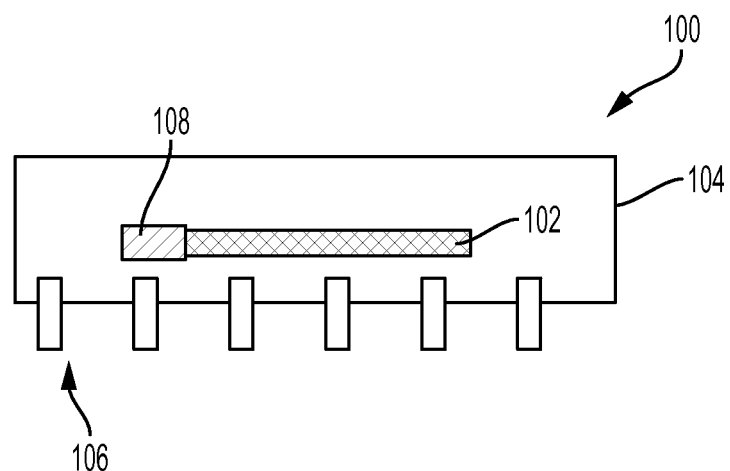
FIG. 1 depicts a semiconductor assembly with a tampering detection device in accordance with an embodiment.

FIG. 1 illustrates an exemplary semiconductor assembly 100 with a tamper detection device in accordance with an embodiment. Specifically, in FIG. 1, the semiconductor assembly 100 includes an integrated circuit 102 enclosed in a package 104. Electrical contacts 106 extend from the package 104 and provide an electrical connection with elements of the integrated circuit 102.

Figure 2:
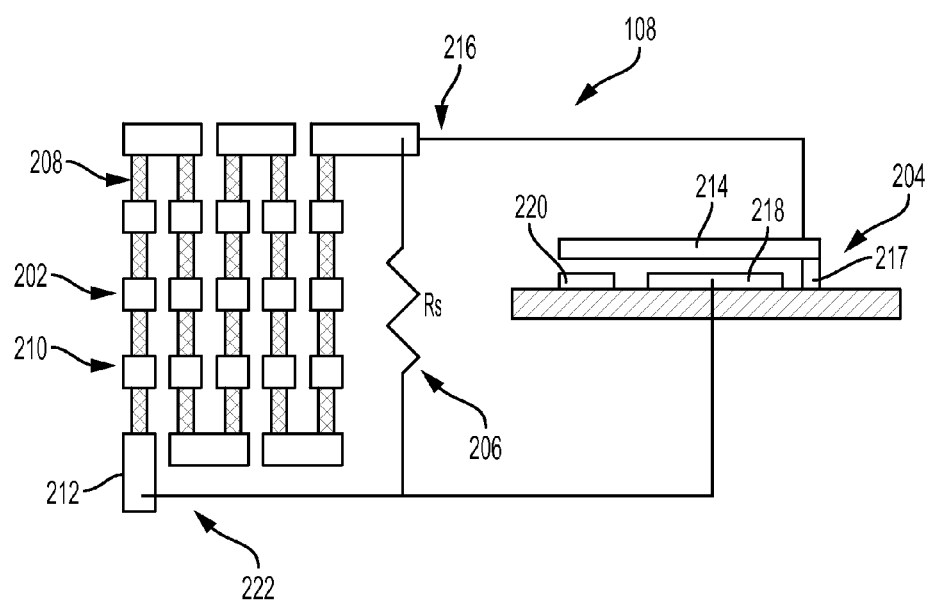
FIG. 2 depicts a light-sensitive circuit in accordance within an embodiment.

In some embodiments, a tamper detection device including light sensitive circuit 108 is disposed within the package 104 of the integrated circuit 102 as shown in FIG. 1. Alternatively, the light sensitive circuit 108 may be electrically isolated from the integrated circuit 102. The light sensitive circuit 108 is covered by the package 104 to limit exposure of the light sensitive circuit 108 to ambient light, for example. In the event that the light sensitive circuit 108 is exposed to a light source due to removal or partial removal of the package 104, (e.g., from tampering, etc.), the light sensitive circuit 108 activates, permanently changing the electrical properties of the light sensitive circuit 108 and/or properties of the integrated circuit 102, thereby indicating a tamper condition. The operation and configurations of the light-sensitive circuit 108 are described in more detail below. FIG. 2 illustrates a light sensitive circuit 108 in accordance with one embodiment. In particular, the light sensitive circuit 108 includes a photovoltaic circuit 202 connected in parallel with a micro-electromechanical system (MEMS) switch 204 and a resistive element 206. The resistive element 206 can be a resistor, a combination of resistors in series or parallel, or any other type of resistive device. The resistive element 206 is optional, but provides an increased output voltage of the light sensitive circuit 108, as described in more detail. The photovoltaic circuit 202 includes a plurality of photovoltaic cells 208 arranged sequentially in a series configuration. Alternatively, the photovoltaic circuit 202 may include a single photovoltaic cell. Although a series configuration of photovoltaic cells 208 is shown, other arrangements of the photovoltaic cells 208 are contemplated by other embodiments.

The photovoltaic circuit 202 includes a plurality of contact pads 210 that electrically connect adjacent photovoltaic cells. Terminating contact pads 212 form nodes of the photovoltaic circuit 202, at the parallel connection of the MEMS switch 204 and the resistive element 206.

When exposed to light source such as sunlight, a lamp, or any other light source, the photovoltaic cells 208 generate an electrical current. A series configuration of the photovoltaic cells 208 increases the open circuit output voltage generated by the photovoltaic circuit 202. The resistive element 206 acts to provide a linear relationship between the electrical current and voltage between the nodes of the photovoltaic circuit 202, increasing sensitivity of the light sensitive circuit 108. The resistive element 206 is configured to generate a voltage across the MEMS switch 204 in response to the current generated by the photovoltaic circuit 202.

Further details of the MEMS switch 204, according to an embodiment, are also shown in FIG. 2. The MEMS switch 204 includes an arm 214 electrically connected to a first node 216 of the light sensitive circuit 108. The arm 214 is mechanically affixed to a base structure 217 at one end thereof, and is suspended at a second end thereof so as to define a cantilever. The MEMS switch 204 further includes a pull-in electrode 218 and a contact electrode 220 affixed to the base structure 217, and are connected to the second node 222 of the photovoltaic circuit 202. Prior to activation of the photovoltaic circuit 202, the arm 214 and the pull-in electrode 218 are separated by a space, which electrically isolates the pull-in electrode 218 and the contact electrode 220 from the arm 214.

The exposure of the photovoltaic cells 208 to a light source causes the photovoltaic cells 208 to generate an electrical current. Accordingly, a voltage differential is also generated across the resistive element 206 and across the MEMS switch 204 upon generation of the electrical current. The first node 216 of the light sensitive circuit is electrically connected to the arm 214, and the second node 222 of the light sensitive circuit 108 is connected to the pull-in electrode 218.

Figure 3:
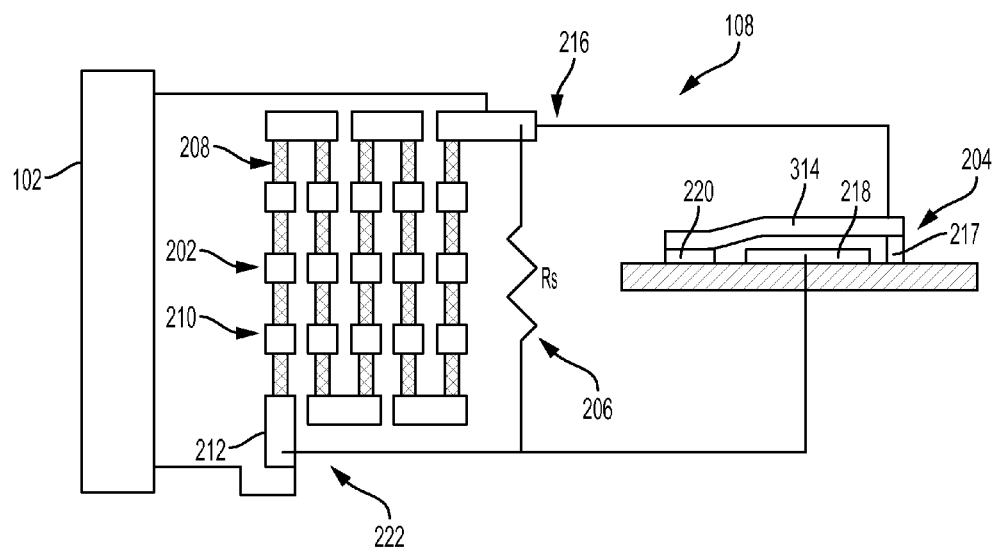
FIG. 3 illustrates a light-sensitive circuit electrically connected to an integrated circuit in accordance with an embodiment.

The difference in voltage potential between the arm 214 and the pull-in electrode 218 creates an electrostatic force between the arm 214 and the contact electrode 220. The electrostatic force causes the arm 214 to deflect and come into contact with the contact electrode 220, creating a shorted circuit or wire between the first node and the second node, as shown in FIG. 3. In one embodiment, the force between the pull-in electrode 218 and the arm 214 causes the arm 214 to bend and strike the contact electrode 220. The impact force of the arm 214 with the contact electrode 220 results in a permanent connection between the arm 214 and the contact electrode 220 of the MEMS switch 214, even in the event the source of the light is subsequently removed. Accordingly, the arm 214 and the contact electrode 220 remain electrically connected after exposure of the photovoltaic cells 208 to the light source is discontinued.

The attachment of the contact electrode 220 with the arm 214 of the MEMS switch 204 is facilitated by a roughened surface on the arm 214 and/or the contact electrode 220. The roughened surface(s) act to provide an additional bonding capability for the arm 214 and the contact electrode 220. The arm 214, the pull-in electrode 218 and the contact electrode 220 can be made of aluminum or any other suitable conductive material.

Referring to FIG. 3 with continuing reference to FIG. 2, FIG. 3 further illustrates a light-sensitive circuit 108 electrically connected to the integrated circuit 102. In this embodiment, the integrated circuit 102 is electrically connected to at least one node of the light-sensitive circuit 108. Light exposure induces a current in the light-sensitive circuit 108, causing the MEMS switch 204 of the light-sensitive circuit 108 to close. Because of the electrical connection with the integrated circuit 102, operating parameters of the integrated circuit 102 are changed. For example, the conductive path formed by the MEMS switch 204 of the light-sensitive circuit 108 may short-circuit a component of the integrated circuit 102, inhibiting or disabling the operation of the integrated circuit 102.

Figure 4:
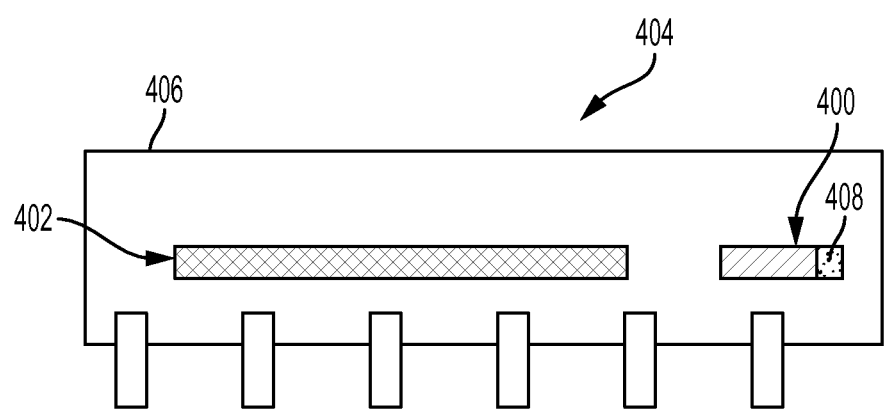
FIG. 4 illustrates a light-sensitive circuit electrically connected to a radio-frequency identification tag in accordance with an embodiment.

FIG. 4 illustrates a light-sensitive circuit 400 electrically isolated from the integrated circuit 402 and packaged within the semiconductor device 404. In this embodiment, the removal of the package 406 and/or exposure of the light-sensitive circuit 400 to ambient light, for example, causes a short-circuit in the light sensitive circuit 400. Although the light-sensitive circuit 400 is electrically isolated from the integrated circuit 402, the light-sensitive circuit 400 can be electrically connected to a passive radio-frequency tag 408, for example. The passive radio-frequency tag 408 may indicate to that exposure to a light source has occurred and that the light-sensitive circuit 400 has activated (i.e., a switch has closed). A user may detect the change with any suitable radio-frequency analysis tool, allowing the user to leave the package 406 in place while a determination of semiconductor integrity is performed.

Figure 5:
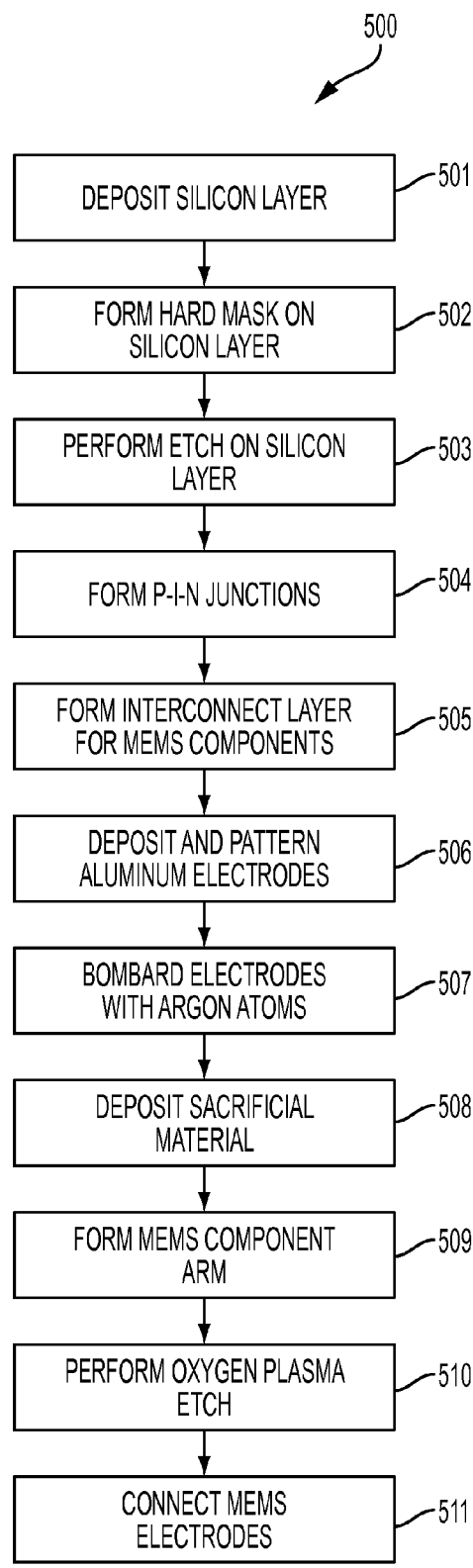
FIG. 5 is a flow diagram illustrating a process for manufacturing the light-sensitive circuit in accordance with an embodiment.

Referring now to both FIG. 5 and the accompanying views of FIGS. 6A-6J, FIG. 5 is a flow diagram that illustrates a method of manufacture of the light-sensitive circuit in accordance with one embodiment. At block 501, with reference to FIG. 6A, a thin silicon layer 551 (e.g. 10 nm to 10 μm) is formed on an insulating substrate 552 to begin a process of forming the photovoltaic cells. The thin silicon layer 551 may be deposited by at least one of a silicon spalling technique, poly-silicon deposition with annealing, or a direct silicon on insulator wafer.

Figure 6A:
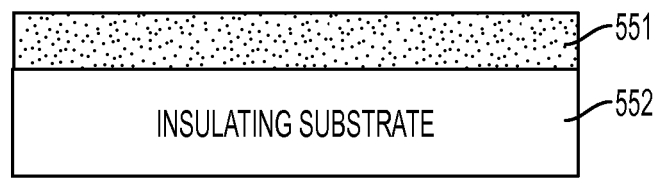
Figure 6B:
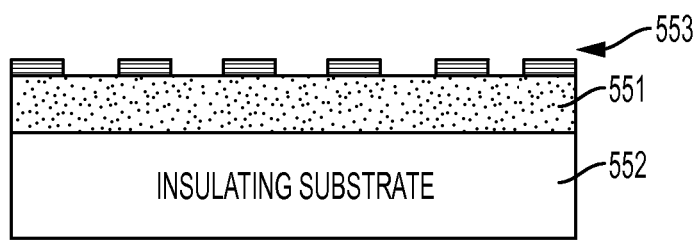

At block 502, a silicon dioxide hard mask deposition is performed and a silicon dioxide hard mask 553 is deposited as shown in FIG. 6B. The silicon dioxide hard mask 553 provides a protective surface on the thin silicon layer 551 during a subtractive etching process. In this embodiment, the silicon dioxide hard mask 553 is formed and then selectively patterned on a top surface of the thin silicon layer 551.

Figure 6C:
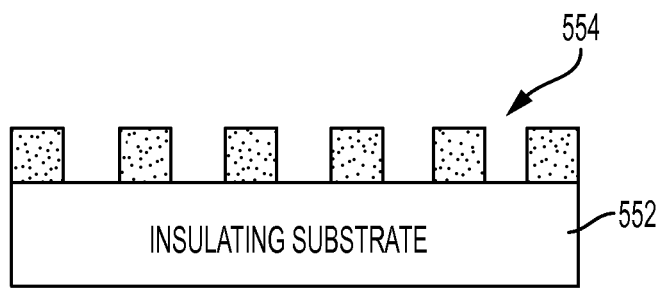
Figure 6D:
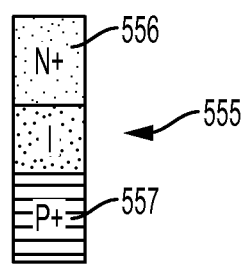
Figure 6E:
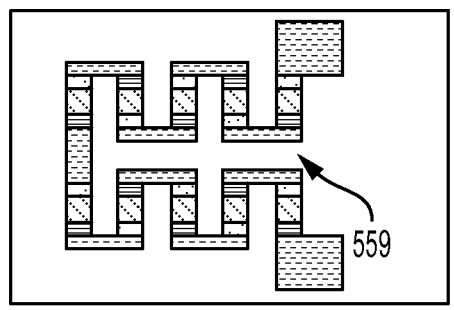

At block 503 and as shown in FIG. 6C, a silicon RIE (reactive ion etching) etch is performed to transfer the hard mask pattern into the silicon layer 551, thereby defining silicon planks 554 on the insulating substrate 552 that correspond to the pattern of the silicon dioxide hard mask 553. Following the etching process of block 503, the silicon dioxide hard mask 553 is removed through reactive ion etch or wet etch, for example. Then, as shown in block 504 of FIG. 5 and the top view of FIG. 6D, the silicon planks 554 are subject to a doping process so as to form p-i-n junctions. For example, ion implantation of phosphorous (n+) at one end of the plank and boron (p+) at the opposite end of the plank can be implemented with sequential photoresist and/or hard mask steps to form a p-i-n junction having an undoped intrinsic region 555, an N+ region 556 and a P+ region 557. At block 505 as shown by FIG. 6E, an interconnect layer 559 is formed to electrically the photovoltaic cells. The interconnect layer 559 may be formed by depositing and patterning a titanium/gold alloy or a chromium/gold alloy, for example. In addition to connecting the silicon planks, the interconnect layer 558 may include at least two pads formed for connection with the MEMS switch and other components of the light-sensitive circuit.

Figure 6F:
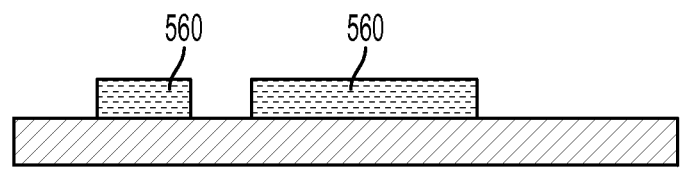
Figure 6G:
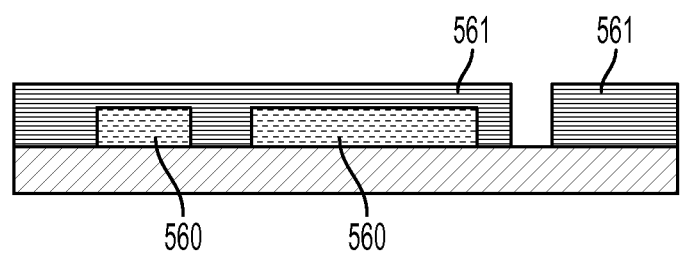
Figure 6H:
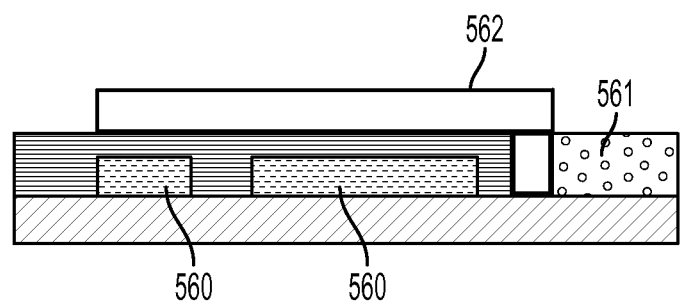
Figure 6I:
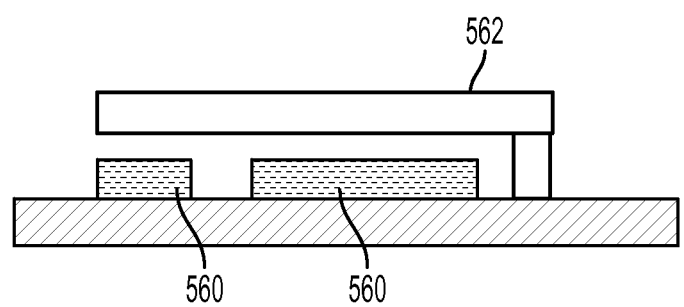

At block 506 and as shown in FIG. 6F, electrodes 560 are deposited and patterned using aluminum, for example. The electrodes 560 connect the MEMS switch with the at least one pad of the photovoltaic cells. In one embodiment, the electrodes 506 include a contact electrode and a pull-in electrode. Optionally, at block 507, argon atoms are bombarded on the surfaces of the electrodes, to roughen the electrodes and improve adhesion upon contact of the arm with the contact electrode, for example. At block 508 and as shown in FIG. 6G, a sacrificial material 561, for example parylene, is deposited on the electrodes 560 and the space surrounding the electrodes 560. The parylene 561 forms a mounting surface on which an arm 562 is formed as shown in FIG. 6H. At block 509, aluminum can be deposited and patterned to form the arm 562 of the MEMS switch. In one embodiment, the arm 562 is a cantilever that bends in response to an applied voltage. At block 510, an oxygen-plasma etch is performed to remove the parylene 561 and expose a space between the arm 562, the pull-electrode, and the contact electrode as shown in FIG. 6J. At block 511, MEMS electrodes are connected to the photovoltaic cells in a light-controlled environment. The control of light is avoids triggering the MEMS switch (e.g., activating the making contact with the arm and the contact electrode).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a tamper detection device for an integrated circuit, comprising:
    depositing a silicon layer on an insulating substrate;
    forming a patterned hard mask on the silicon layer;
    etching exposed portions of the silicon layer to form a plurality of silicon planks;
    removing the hard mask from the plurality of silicon planks;
    implanting ions defined by photoresist to form at least one PIN junction on the plurality of silicon planks, the PIN junction has a undoped intrinsic semiconductor region between a p-type semiconductor region and an n-type semiconductor region, the at least one PIN junction forms a photovoltaic cell;
    forming an interconnect layer that electrically connects a plurality of photovoltaic cells;
    depositing patterned electrodes of a micro-electromechanical system (MEMS) switch on the interconnect layer, the patterned electrodes include a pull-in electrode and a contact electrode;
    depositing a sacrificial material over the patterned electrodes;
    forming an arm of the MEMS switch on the sacrificial material, the arm includes a cantilever;
    etching the sacrificial material from the patterned electrodes; and
    connecting the MEMS switch with the plurality of photovoltaic cells; wherein
    the plurality of photovoltaic cells comprise a light-sensitive circuit disposed within a package of an integrated circuit, wherein the light-sensitive circuit closes in response to an exposure to a light source, thereby indicating a tamper condition; and
    wherein the light-sensitive circuit further comprises a resistive element connected in parallel with the MEMS switch and the plurality of photovoltaic cells, the resistive element configured to generate a voltage across the MEMS switch in response to a current generated by the photovoltaic circuit.

2. The method of claim 1, further comprising bombarding the surfaces of the patterned electrodes with argon atoms to provide roughened contact surfaces on the patterned electrodes.

3. The method of claim 1, wherein the p-type semiconductor region comprises boron and the n-type semiconductor region comprises phosphorous.

4. The method of claim 1, wherein the thin silicon layer is made by at least one of a silicon spalling technique, a poly-silicon deposition with annealing, and a direct silicon-oxide wafer.

5. The method of claim 1, wherein the MEMS switch comprises an arm, a contact electrode, and a pull-in electrode.

* * * * *